(12) United States Patent
Sakata

(10) Patent No.: US 6,399,404 B2
(45) Date of Patent: Jun. 4, 2002

(54) FABRICATING METHOD OF OPTICAL SEMICONDUCTOR DEVICE

(75) Inventor: Yasutaka Sakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/407,091

(22) Filed: Sep. 28, 1999

(30) Foreign Application Priority Data

Sep. 28, 1998 (JP) .......................................... 10-272681

(51) Int. Cl.$^7$ ................................................ H01L 21/00
(52) U.S. Cl. ............................ 438/22; 438/71; 438/39; 438/69; 438/70; 385/14
(58) Field of Search ............................. 438/22, 31, 32, 438/35, 39, 69, 70, 71, 72, 73; 257/79, 103; 385/14

(56) References Cited

U.S. PATENT DOCUMENTS

| 4,279,464 | A | * | 7/1981 | Colombini | 350/96.16 |
| 5,070,509 | A | * | 12/1991 | Meyers | 372/45 |
| 5,101,469 | A | * | 3/1992 | Oda | 385/131 |
| 5,329,542 | A | * | 7/1992 | Westbrook | 372/96 |
| 5,333,219 | A | * | 7/1994 | Kuznetsov | 385/45 |
| 5,448,536 | A | * | 9/1995 | Muranishi et al. | 369/13 |
| 5,663,974 | A | * | 9/1997 | Tsujimura et al. | 372/45 |
| 5,679,965 | A | * | 10/1997 | Schetzina | 257/103 |
| 5,742,415 | A | * | 4/1998 | Manning et al. | 359/128 |
| 5,915,051 | A | * | 6/1999 | Damask et al. | 385/16 |
| 5,956,355 | A | * | 9/1999 | Swanson et al. | 372/20 |
| 6,141,370 | A | * | 10/2000 | Avrutsky et al. | 372/102 |
| 6,174,749 | B1 | * | 1/2001 | Yuen et al. | 438/35 |

OTHER PUBLICATIONS

K. Kudo et al., "1.52–1.59–$\mu$m Range Different–Wavelength Modulator–Integrated DFB–LD's Fabricated on a Single Wafer", vol. 10, No. 7, Jul. 1998, *IEEE Photonics Technology Letters*, pp. 929–931.

* cited by examiner

Primary Examiner—Matthew Smith
Assistant Examiner—Renzo N. Rocchegiani
(74) Attorney, Agent, or Firm—Young & Thompson

(57) ABSTRACT

In an optical semiconductor device fabrication method for simultaneously forming elements having different operation wavelengths on a circular semiconductor substrate, the number of elements for each operation wavelength is made constant efficiently and the operation characteristics of the elements are made highly uniform, by parabolically changing the operation wavelength of the optical semiconductor device from a center portion of the circular semiconductor substrate toward an outer periphery thereof.

33 Claims, 13 Drawing Sheets

FABRICATING METHOD OF OPTICAL SEMICONDUCTOR DEVICE

BACKGROUND OF THE INVENTION

1. Field of the Invention

The present invention relates to a fabrication method of an optical semiconductor device and, particularly, to a fabrication method of a semiconductor laser and an optical modulator for use in a WDM (wavelength division multiplexing) transmission system.

2. Description of the Related Art

Research and development of optical communication systems using WDM for transmitting optical signals having different wavelengths through a single optical fiber have been actively made as a means for substantially expanding the optical communication capacity using the existing optical fiber network. In the basic trunk network into which the WDM system is mainly introduced, optical signals modulated at a speed not lower than several G bits/sec are transmitted through the optical fiber at least several hundreds kilometers long. Therefore, a DFB (distributed feedback) laser having high spectral purity has been utilized as a light source and an external modulation system in which wavelength is not varied during a modulating operation has been used in modulating the optical signal. As a modulator for use in the external modulation, a semiconductor EA (electro-absorption) modulator or a LN (lithium niobate) modulator has been utilized. Particularly, since the EA modulator can be monolithically integrated with the DFB laser as the light source, it is effective in reducing the size and power consumption and is the key device of a high density WDM system. Since the basic purpose of the WDM system is to transmit optical signals having different wavelengths through a single optical fiber, DFB lasers having various oscillation wavelengths are required as light sources and optical modulators corresponding to the respective wavelengths are required. In a fabrication method of a usual EA modulator integrated DFB laser, an element having only one oscillation wavelength or operation wavelength can be obtained from one semiconductor substrate. In view of this fact, a method for forming optical semiconductor devices having different operation wavelengths (operation energies) on a semiconductor substrate as an optical semiconductor element adaptable to the WDM has been proposed in K. Kudo et al, IEEE, Photonics Technology Letters, July, 1998, pp. 929 to 931. The proposed technology is very effective as the method of fabricating the light sources for the WDM since it is possible to obtain EA modulator integrated DFB lasers having 40 (forty) wavelengths from a single semiconductor substrate. In the proposed technology, gratings having same pitch are arranged in one direction of the substrate as shown in FIG. 18.

However, the gratings have the same pitch with respect to one direction of the substrate as shown in FIG. 18, that is, elements having different oscillation wavelengths are arranged according to some linear function, that is, linearly with respect to a certain direction of the substrate as shown in FIG. 19(*a*). Therefore, when the elements are formed on a circular substrate, the number of elements formed in a center portion of the substrate becomes different from that of the elements formed in an edge portion thereof. Thus, the number of elements that can be fabricated on a single substrate varies substantially depending upon oscillation wavelength as shown in FIG. 19(*b*). Therefore, the proposed technique is inadequate as the fabrication method of light source for WDM.

SUMMARY OF THE INVENTION

An object of the present invention is to provide a fabrication method for fabricating optical semiconductor devices including DFB laser diodes having different oscillation wavelengths, EA modulators having different band gap wavelengths of absorption layers thereof or elements formed by the DFB laser diodes monolithically integrated with the EA modulators on a circular semiconductor substrate such as a 2-inch InP substrate, the number of semiconductor elements having a different one of operation wavelengths (oscillation wavelengths or absorption wavelengths), is constant. Particularly, an object of the present invention is to provide a fabrication method with which a constant number of elements for each operation wavelength can be obtained most efficiently from a usual circular substrate.

An according to the present invention, an optical semiconductor device fabrication method for simultaneously fabricating optical semiconductor devices having different operation wavelengths (operation energy) on a single circular semiconductor substrate is featured by that the number of elements having each of the operation wavelengths can be made constant.

A first aspect of the present invention resides in a method for fabricating an optical semiconductor device on a circular semiconductor substrate, which is featured by comprising parabolically changing an operation band gap energy (band gap wavelength) of the optical semiconductor device from a center portion of the circular semiconductor substrate toward an outer periphery of the circular semiconductor substrate.

A second aspect of the present invention resides in a method for fabricating a semiconductor laser on a circular semiconductor substrate, which is featured by comprising parabolically changing an oscillation wavelength of the semiconductor laser from a center portion of the circular semiconductor substrate toward an outer periphery of the circular semiconductor substrate.

A third aspect of the present invention resides in the method for fabricating a semiconductor laser according to the second aspect, which is further featured by that the semiconductor laser is a DFB-LD (distributed feedback laser diode) or a DBR-LD (distributed Bragg reflector laser diode).

A fourth aspect of the present invention resides in the method for fabricating a semiconductor laser according to the third aspect, which is further featured by that a pitch of gratings formed in a waveguide or in the vicinity of the waveguide is parabolically changed from a center portion of the circular semiconductor substrate toward an outer periphery of the circular semiconductor substrate.

A fifth aspect of the present invention resides in the method for fabricating a semiconductor laser according to the third or fourth aspect, which is further featured by that Eb−Eg is constant in a range from −5 meV to +15 meV and, preferably, from ±0 meV to +10 meV, where Eb is energy of Bragg wavelength (laser oscillation wavelength) determined by the gratings pitch and Eg is energy of a gain peak wavelength of an active layer of the laser.

A sixth aspect of the present invention resides in a method for fabricating a semiconductor optical modulator of an EA type, on a circular semiconductor substrate, which is featured by comprising parabolically changing a band gap wavelength of an optical absorption layer of the semiconductor optical modulator from a center portion of the circular semiconductor substrate toward an outer periphery of the circular semiconductor substrate.

A seventh aspect of the present invention resides in a method for fabricating a semiconductor optical integrated device having a DFB-LD monolithically integrated with a semiconductor optical modulator of an EA type or a DBR-LD monolithically integrated with a semiconductor optical modulator of an EA type, on a circular semiconductor substrate, which is featured by comprising parabolically changing both a band gap wavelength of an optical absorption layer of the semiconductor optical modulator and an oscillation wavelength of the DFB-LD or the DBR-LD from a center portion of the circular semiconductor substrate toward an outer periphery of the circular semiconductor substrate.

An eighth aspect of the present invention resides in the method for fabricating a semiconductor laser according to the seventh aspect, which is further featured by that Em–Eb is constant in a range from 20 meV to 40 meV and, preferably, from 25 meV to 35 meV, where Em is band gap energy of the optical absorption layer of the EA modulator and Eb is energy of the DFB-LD or DBR-LD.

A ninth aspect of the present invention resides in a method for fabricating an optical semiconductor device on a circular semiconductor substrate, which is featured by comprising growing a semiconductor layer constituting the optical semiconductor device by MOVPE (metal-organic vapor phase epitaxy) and changing a temperature of the semiconductor substrate such that the band gap wavelength of the epitaxially grown layer is parabolically changed in a surface of the semiconductor substrate from a center portion of the semiconductor substrate toward an outer periphery thereof.

A tenth aspect to the present invention resides in a method for fabricating an optical semiconductor device on a circular semiconductor substrate, which is featured by comprising of growing a semiconductor layer constituting the optical semiconductor device by selective MOVPE using a dielectric film as a growth blocking mask and changing a width of the growth blocking mask such that the band gap wavelength of the epitaxially grown layer is parabolically changed in a surface of the semiconductor substrate from a center portion of the semiconductor substrate toward an outer periphery thereof.

An eleventh aspect of the present invention resides in a method for fabricating an optical semiconductor device on a circular semiconductor substrate, which is featured by comprising of growing a semiconductor layer constituting said optical semiconductor device by selective MOVPE using a dielectric film as a growth blocking mask and changing a width of an opening portion of the growth blocking mask such that the band gap wavelength of the epitaxially grown layer is parabolically changed in a surface of said semiconductor substrate from a center portion of the semiconductor substrate toward an outer periphery thereof.

A twelfth aspect of the present invention resides in the method of fabricating an optical semiconductor device according to any of the first to eleventh aspects, which is further featured by that the parabolic distribution of the operation and gap energy is approximated by a plurality of steps.

A first effect of the present invention is that, in the fabrication method of an optical semiconductor device for forming elements having different operation wavelengths on a circular semiconductor substrate, the number of elements having each of operation wavelengths obtainable from the semiconductor substrate can be efficiently made constant.

The reason for this is that the operation wavelengths of the optical semiconductor device are changed parabolically from a center portion of the substrate to an outer peripheral portion of the substrate.

A second effect of the present invention is that an optical semiconductor device applied to a DFB laser can operate highly uniformly with low threshold current and high efficiency at any of different oscillation wavelengths thereof.

The reason for this is that it is possible to always define an energy difference between DFB oscillation wavelength defined by the grating pitch and the gain peak wavelength defined by the crystal structure within a constant range.

A third effect of the present invention is that an optical semiconductor device applied to an EA modulator integrated DFB laser can operate highly uniformly with low threshold current, high efficiency and high light extinction ratio, at any of different oscillation wavelengths thereof.

The reason for this is that it is possible to always define an energy difference between DFB oscillation wavelength defined by the grating pitch and the gain peak wavelength defined by the crystal structure and an energy difference between the DFB oscillation wavelength and the band gap wavelength of the absorption layer of the modulator within a constant range.

BRIEF DESCRIPTION OF THE DRAWINGS

The above and other objects, features and advantages of the present invention will become more apparent from the following description taken in conjunction with the accompanying drawings, in which.

DETAILED DESCRIPTION OF THE PREFERRED EMBODIMENTS

An embodiment of the present invention will be described in detail with reference to the drawings.

Referring to FIGS. 1(a) to 2(b) which show characteristics curves of an optical semiconductor device having a plurality of optical semiconductor elements, which are formed on a circular semiconductor substrate according to an embodiment of the present invention and have different operation wavelengths, an operating band gap energy (band gap wavelength) of the optical semiconductor device is parabolically changed from a center portion of the circular semiconductor substrate toward an outer periphery thereof. That is, representing the distance from the center of the circular semiconductor substrate by R, the operating band gap energy at the center of the circular semiconductor substrate by E(0) and the operating band gap energy at a position which is distance R from the center of the circular semiconductor substrate by E(R), $$E(R)=k \cdot R^2+E(0) \ [eV]$$

where k is a proportional coefficient.

By this structure, yield of elements for each of the different operating wavelengths is made constant and maximum. In addition, this structure is suitable for the usual MOVPE apparatus in which raw material gas is supplied from the top of the semiconductor substrate, because the distribution of the crystal growth layer in the semiconductor substrate surface becomes shaped like the concentric circle with the flow of raw material gas from center portion of the circular semiconductor substrate toward an outer periphery thereof.

Figure 5A:
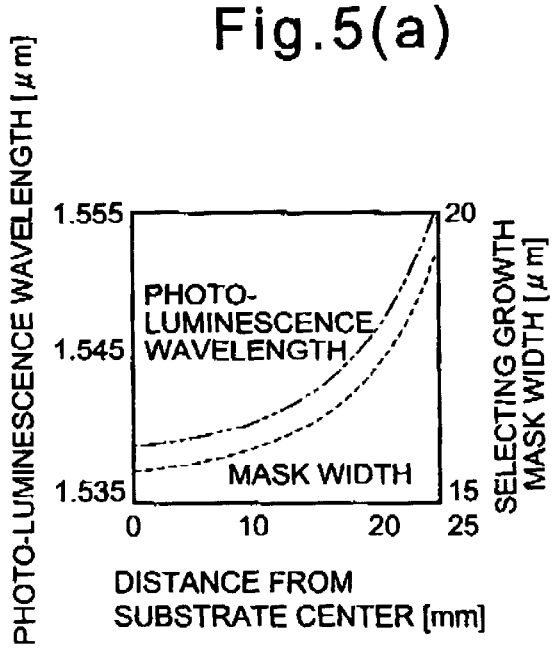
FIGS. 5(a) and 5(b) show characteristics curves illustrating the principle of the present invention.
Figure 5B:
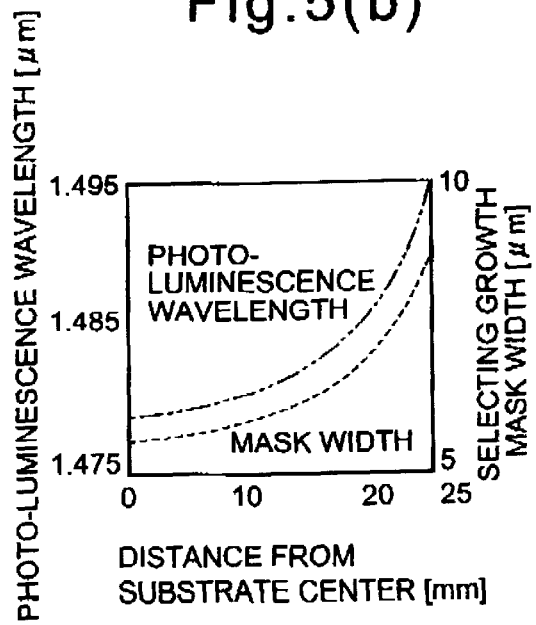
Figure 6:
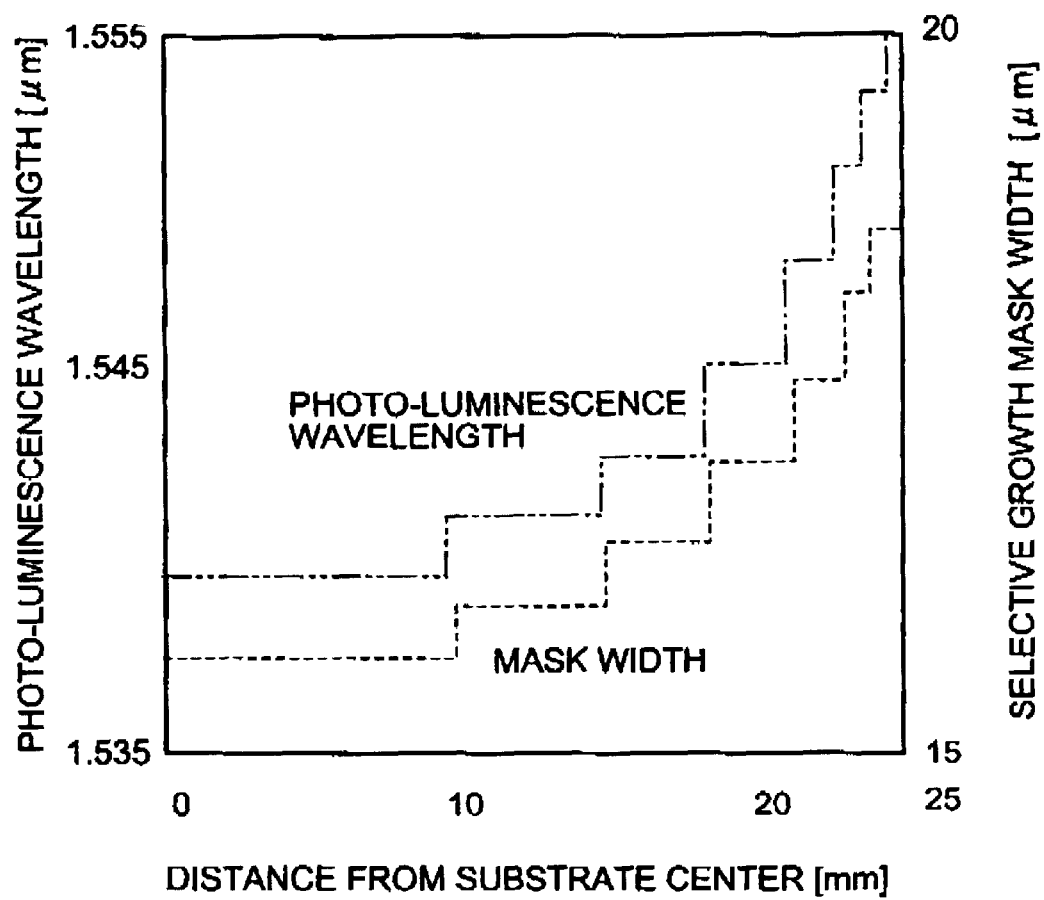
FIG. 6 shows characteristics distributions illustrating the principle of the present invention.
Figure 7:
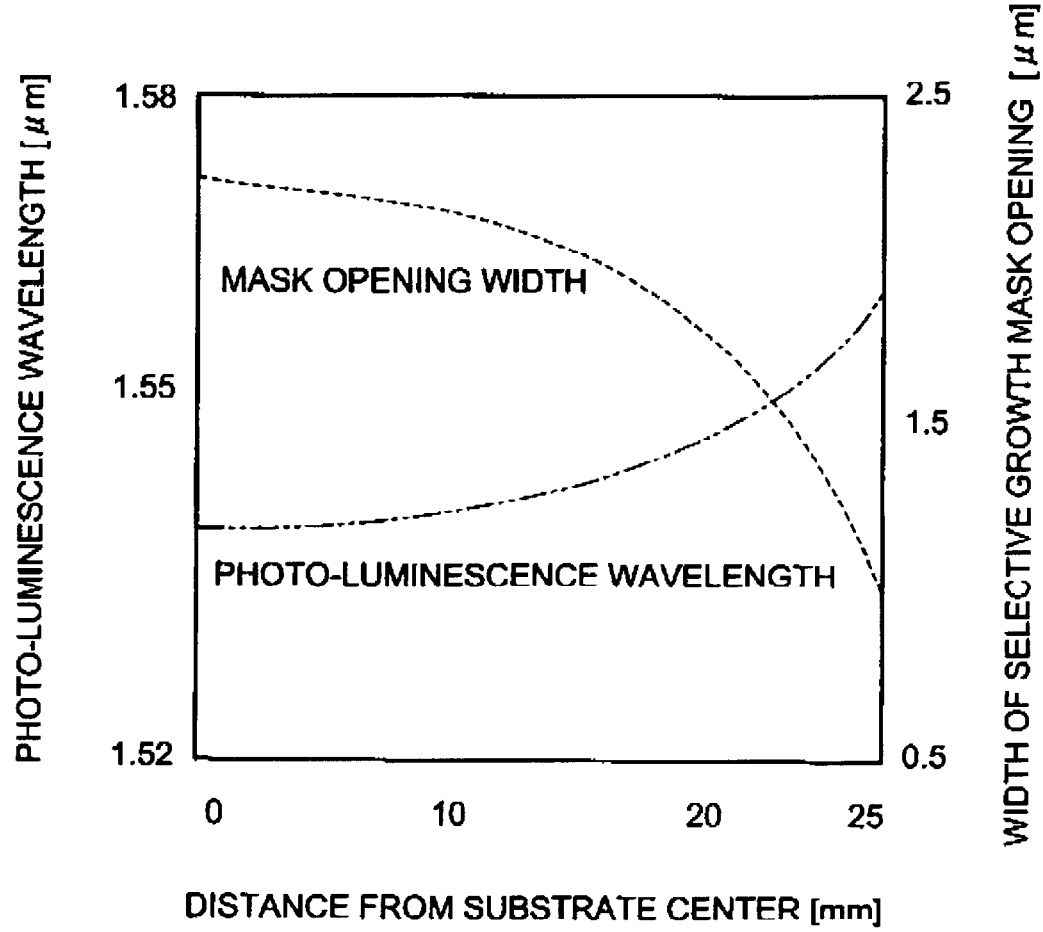
FIG. 7 shows characteristics curves illustrating the principle of the present invention.
Figure 8:
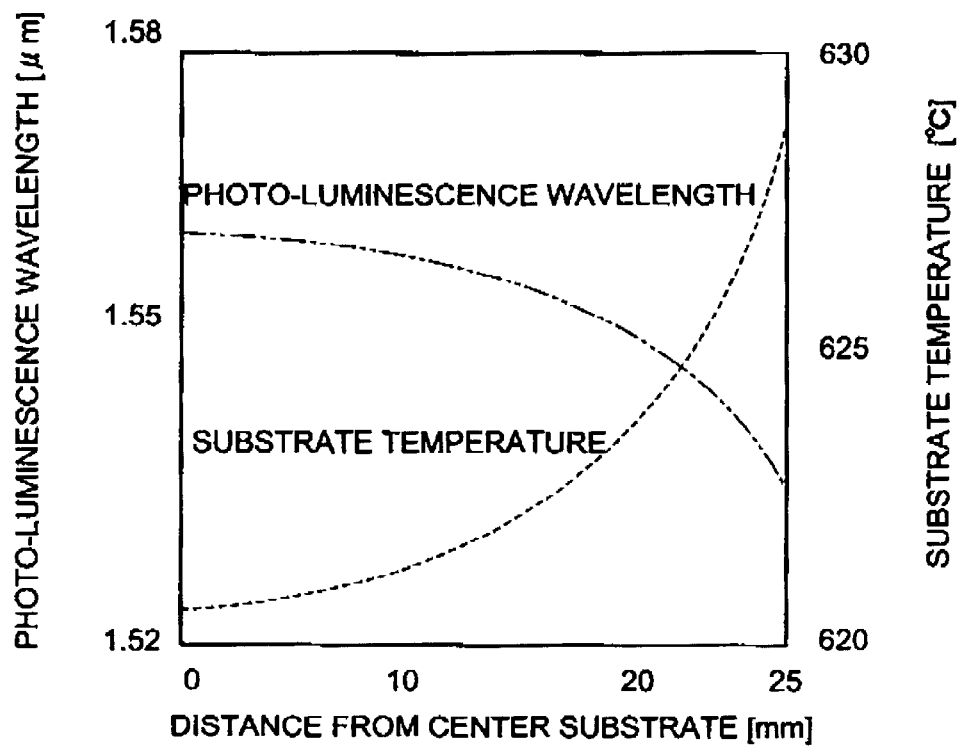
FIG. 8 shows characteristics curves illustrating the principle of the present invention.

In order to achieve such parabolic distribution of oscillation wavelength in a surface of the circular semiconductor substrate, it has been known that the pitch of grating, which defines the oscillation wavelength of a DFB laser, can be precisely controlled by using EB (electron beam) exposure and, further, in order to control a photo-luminescence wavelength (band gap wavelength) distribution in forming an active layer of a DFB laser and/or an absorption layer of an optical modulator by using selective MOVPE, it has been known that thickness and constituents of a selectively grown layer can be controlled by changing a width of a growth blocking mask and, therefore, it is possible to control the photo-luminescence wavelength distribution of the selectively grown layer by changing the width of the growth blocking mask from the center portion of the substrate toward the outer periphery thereof as shown in FIGS. 5(a) and 5(b). Similarly, since, when crystal is grown by selective MOVPE, the film thickness can be controlled by a width of an opening portion of the mask, it is possible to control the photo-luminescence wavelength distribution of the selectively grown layer by changing the width of the opening portion of the mask from the center portion of the substrate toward the outer periphery thereof as shown in FIG. 7. Further, when an InGaAsP layer is grown by MOVPE, a ratio of arsenic to phosphor of the layer, which are group-V materials, is changed with crystal growing temperature. The reason for this is that, since thermal decomposition of phosphine having thermal decomposition efficiency much lower than that of arsine is enhanced with increase of growing temperature, so that phosphor of the grown layer becomes rich (short-wave constituents). Therefore, it is also possible to control the photo-luminescence wavelength of the grown layer by providing a temperature distribution in the plane of the substrate as shown in FIG. 8.

Figure 3:
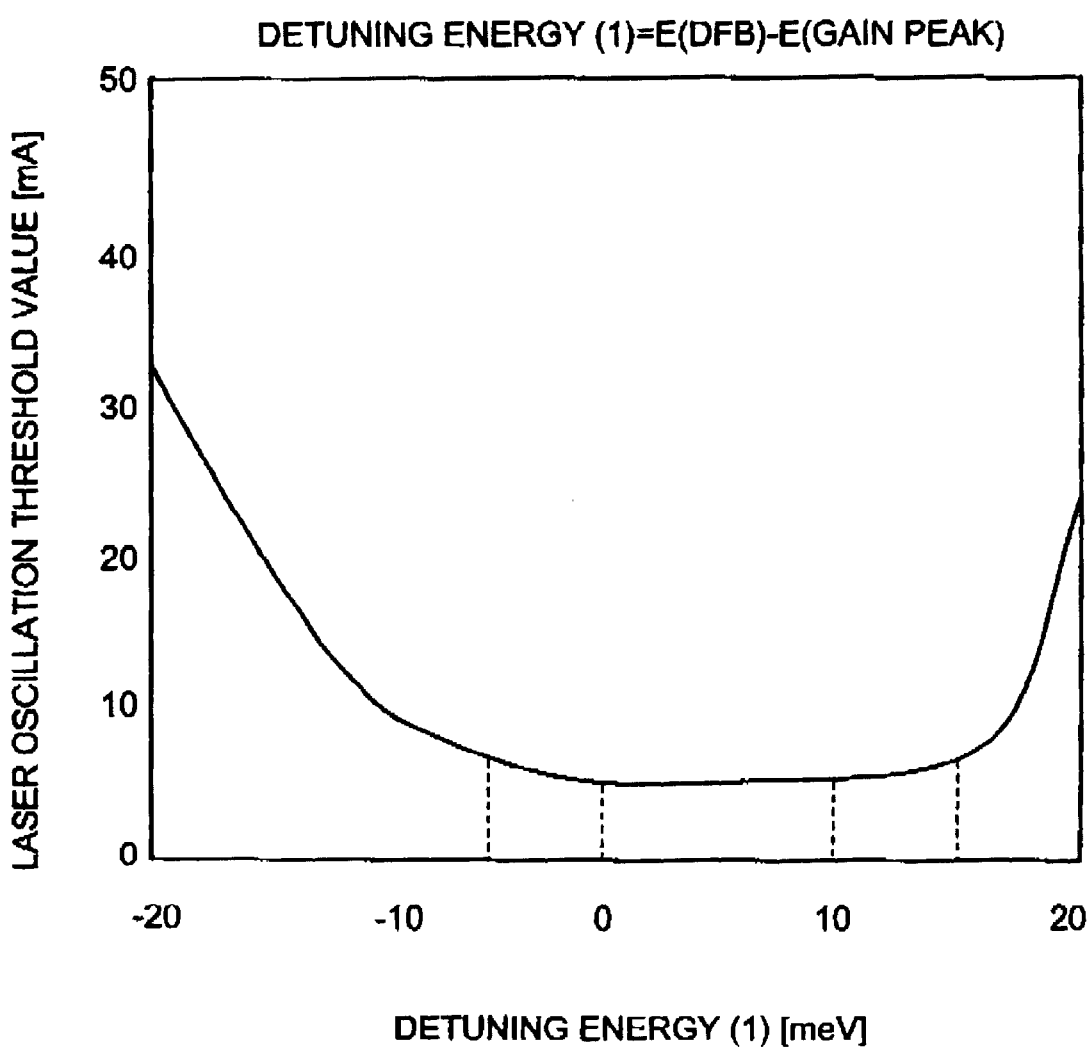
FIG. 3 shows a characteristics curve illustrating the principle of the present invention.

Oscillation wavelength λDFB of the DFB laser is not a gain peak wavelength (corresponding to photo-luminescence wavelength λPL) of the active layer thereof but is determined by λDFB=2·Λ·Neff, where Λ is the pitch of grating and Neff is an equivalent refractive index of a waveguide. Therefore, acceptable laser oscillation characteristics can not be obtained unless a difference between λDFB and the gain peak wavelength is controlled within a certain range. FIG. 3 shows a relation between the difference and the laser oscillation threshold current. In FIG. 3, abscissa indicates a value of the difference between λDFB and the gain peak wavelength, converted into energy. That is, representing the oscillation wavelength energy by E(DFB) and the gain peak energy by E(gain peak), $$E(DFB)=c \cdot h/(e \cdot \lambda DFB) \ [eV]$$

$$E(\text{gain peak})=c \cdot h/(e \cdot \lambda PL) \ [eV]$$

where c is light velocity, h is Planck's constant and e is elementary electric charge.

From FIG. 3, it is clear that the detuning energy (1): ΔE1=E(DFB)−E(gain peak) required for a low threshold current operation should be in a range −5~+15 meV, preferably, 0~+10 meV. Therefore, in the present invention, it is necessary to control the oscillation wavelength distribution and the photo-luminescence wavelength distribution in the surface of the substrate such that the above mentioned conditions are satisfied.

Figure 4:
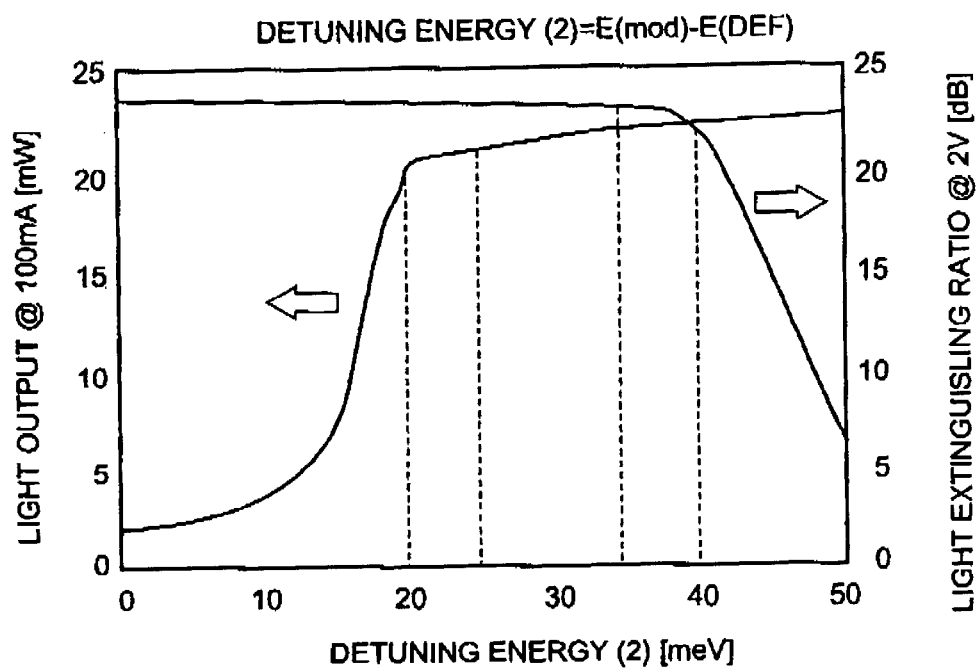
FIG. 4 shows characteristics curves illustrating the principle of the present invention.

Conditions to be satisfied in integrating the EA modulator on the DFB laser will be described. In the EA modulator integrated DFB laser, it is necessary for the DFB laser portion thereof to maintain the relation between E(DFB) and E(gain peak) mentioned with respect to FIG. 3. In addition thereto, the relation between the band gap energy E(mod) of the absorption layer of the EA modulator and the E(DFB) must be controlled within a certain range. This will be described with reference to FIG. 4, which shows a relation between detuning energy (2): ΔE2=E(mod)−E(DFB), optical output of the laser when a current of 100 mA is injected thereto and a light extinction ratio (ON/OFF ratio) when a reverse bias voltage of 2V is applied to the modulator. When ΔE2 becomes small, the absorption loss in the EA modulator is increased and the optical output is substantially reduced. On the contrary, when ΔE2 becomes large, absorption edge does not reach the oscillation wavelength range sufficiently and the light extinction ratio is degraded, even if a reverse bias is applied to the modulator. It is clear from FIG. 4 that, in order to make the optical output and the light extinction ratio compatible, ΔE2 should be within a range 20~40 meV and, preferably, 25~35 meV. Therefore, in the present invention, it is necessary to control the DFB laser oscillation wavelength distribution and the photo-luminescence wavelength distribution of the EA modulator in the surface of the substrate such that the above mentioned conditions are satisfied.

Figure 1A:
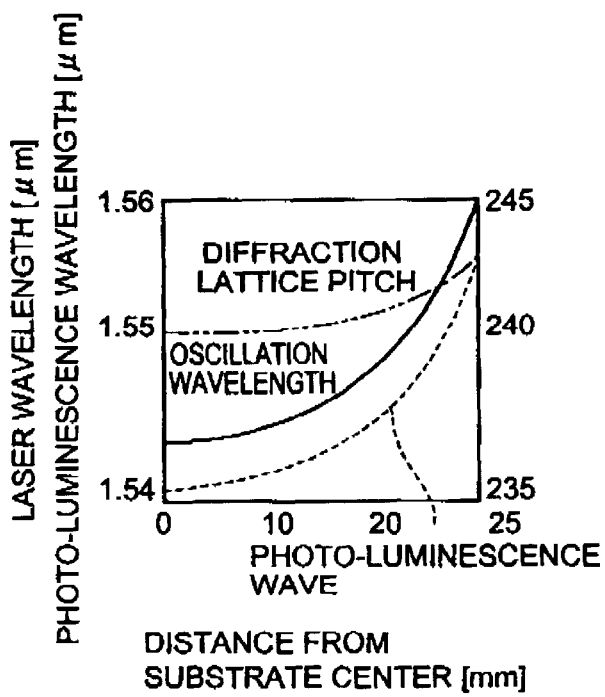
FIGS. 1(a) and 1(b) show characteristics curves illustrating a principle of the present invention.
Figure 9:
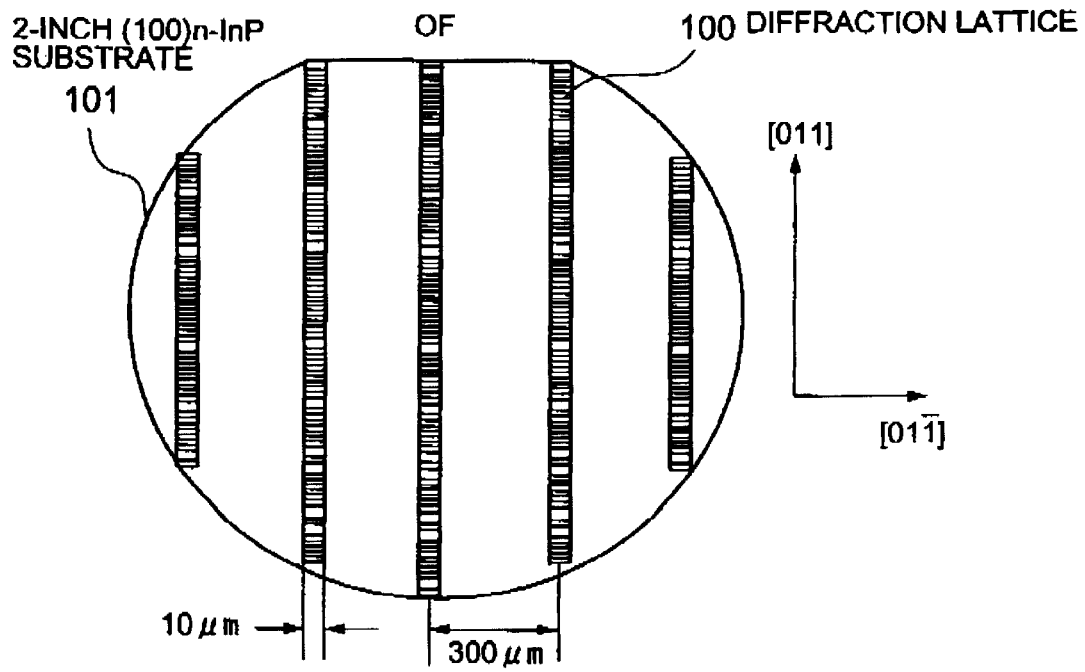
FIG. 9 shows a circular semiconductor substrate formed with diffraction lattices thereon, illustrating an embodiment of the present invention.

According to the embodiment of the present invention gratings 100 each 10 μm wide were formed on a 2-inch (100)

n-InP substrate 101 with an interval of 300 μm between adjacent grating, as shown in FIG. 9, by using EB exposure and chemical etching. In this case, the pitch of the grating 100 was changed parabolically from 240.4 nm in the center portion of the substrate to 243.3 nm in the outer periphery as shown in FIG. 1(a). That is, representing the distance from the center of the circular semiconductor substrate by R [mm], the pitch of the gratings 100 at the center of the circular semiconductor substrate by P(0) and the pitch of the gratings 100 at the position which is distant R from the center of the circular semiconductor substrate by P(R), $$P(R)=P(0)+0.00464 \cdot R^2 \text{ [nm]}$$

Figure 10:
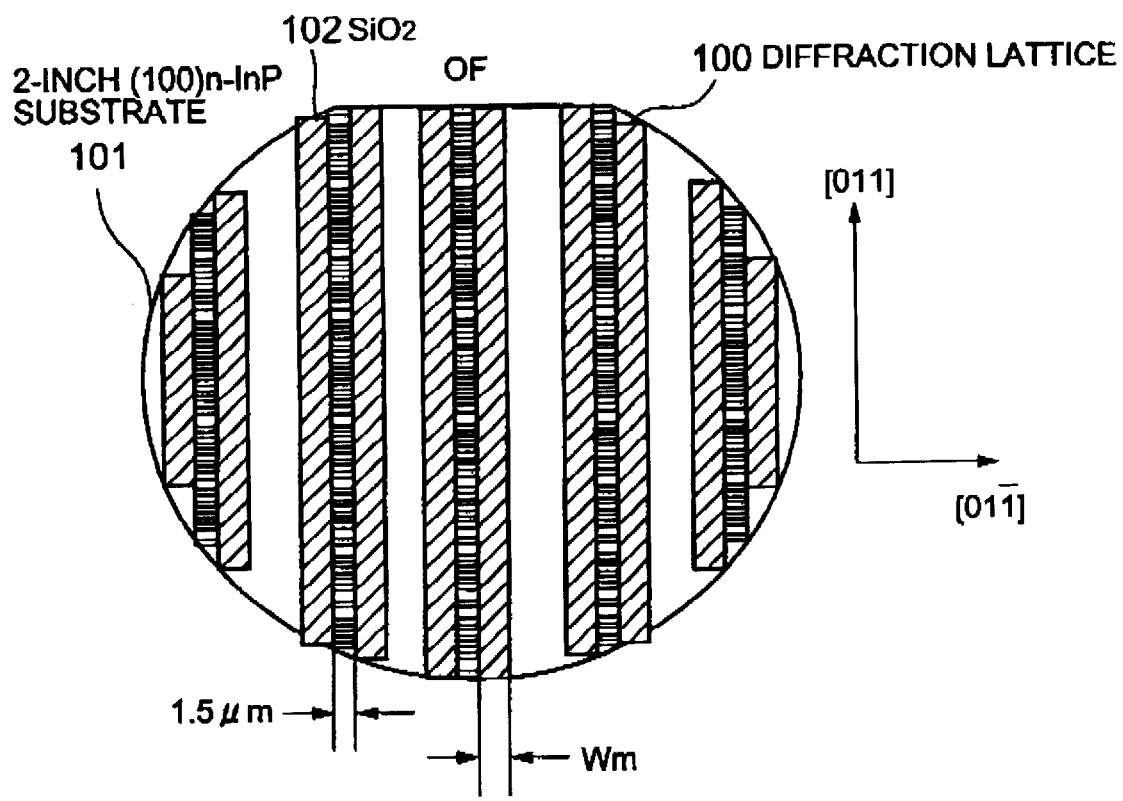
FIG. 10 shows a mask pattern formed on the circular semiconductor substrate, illustrating the embodiment of the present invention.

Then, a SiO$_2$ film 102 having thickness of 100 nm was deposited thereon by atmospheric pressure thermal CVD (chemical vapor deposition). Thereafter, a pair of patterns each Wm wide were formed on each grating 100 in [011] direction with a gap being 1.5 μm therebetween as a selective growth mask by partially removing the SiO$_2$ film 102 with using photolithography and chemical etching, as shown in FIG. 10. The width Wm of the mask was changed parabolically from 16 μm in the center portion of the substrate to 18.5 μm in the outer periphery thereof as shown in FIG. 5(a). On the thus patterned mask, an InGaAsP strain MQW (multiple quantum well) structure was selectively grown by low pressure MOVPE at growing temperature of 625° C. and growing pressure of 100 hPa, as shown by a cross sectional structure in FIG. 11(a). In detail, the layer structure includes an n-InGaAsP (band gap wavelength (λg)=1.13 μm, 70 nm thick), an n-InP spacer layer (40 nm thick), an n-InGaAsP (λg=1.20 μm, 60 nm thick), a multiple quantum well structure formed by repeating formation of a 0.7% compressive strain InGaAsP well (8 nm thick) and an InGaAsP (λg=1.20 μm, 10 nm thick) barrier 8 (eight) times, and a p-InP layer (100 nm thick).

Figure 11A:
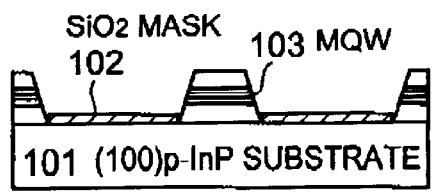
FIGS. 11(a) to 11(e) show cross sections of a wafer illustrating manufacturing steps according to the embodiment of the present invention.
Figure 11B:
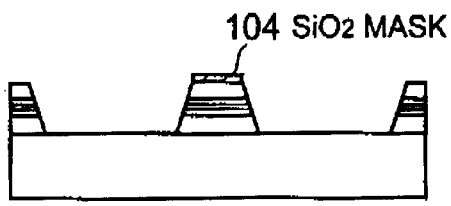
Figure 11C:
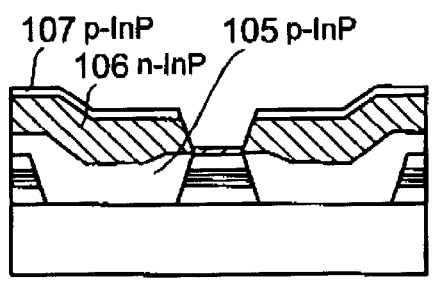
Figure 11D:
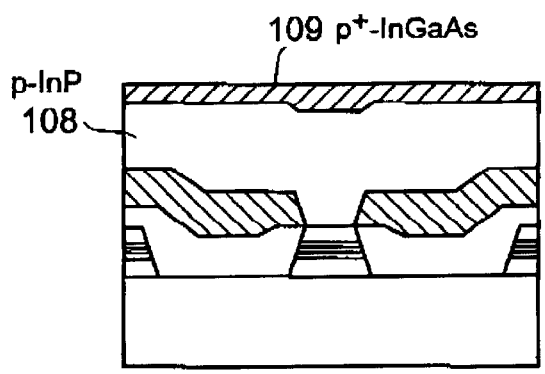
Figure 11E:
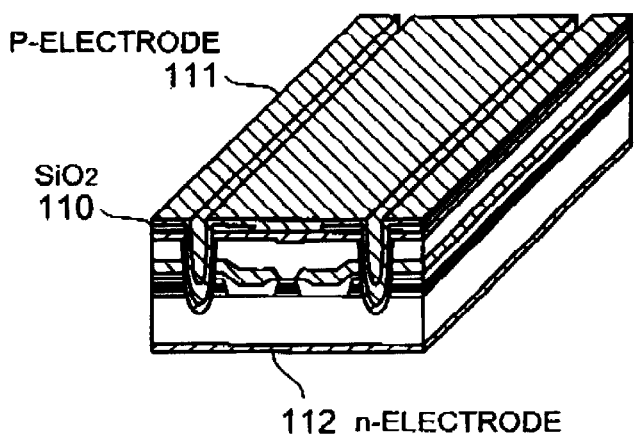

According to measurements of the photo luminescence wavelength distribution in the surface of this strain MQW selectively grown layer by means of a microscopic photo luminescence device, the wavelength was 1.538 μm in the center portion of the substrate, was increased parabolically toward the outer periphery thereof and was 1.565 μm at the outermost portion of the outer periphery, remote from the center portion by 25 mm, as shown in FIG. 11(a). Thereafter, a SiO$_2$ mask 104 was formed on only an upper surface of the strain MQW structure as shown in FIG. 11(b) and current block layers 105, 106 and 107 were formed by using the SiO$_2$ mask 104 as a selective growing mask, to bury the strain MQW structure, as shown in FIG. 11(c). Incidentally, although the p-InP layer 107 is provided in order to prevent a p-n junction from being formed in a re-grown interface, it is not always necessary in the construction of the present invention. Finally, the SiO$_2$ mask 104 was removed and, then, a p-InP clad layer 108 and a p+-InGaAs cap layer 109 were grown as shown in FIG. 11(d). Then, after an electrode forming step, a semiconductor laser was formed as shown in FIG. 11(e). The thus formed elements each 450 μm long were cut out and, after front and rear end faces of the elements were coated with reflection films having reflectivity's of 0.1% and 90%, respectively, characteristics of the elements were evaluated.

Figure 1B:
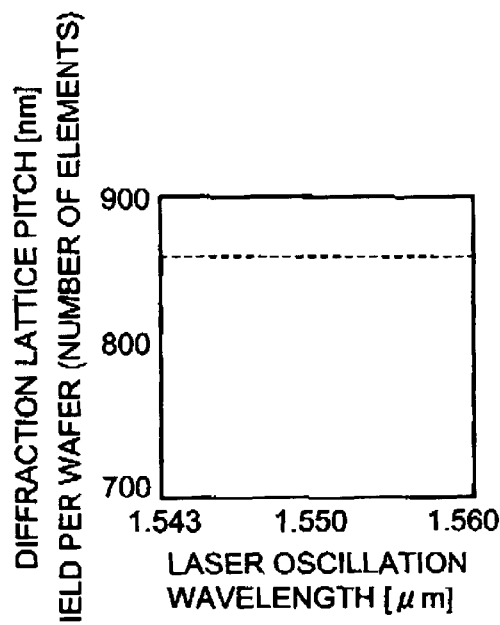

According to the evaluation, it was found that the DFB laser oscillation wavelength in the center portion of the substrate is 1.543 μm, is increased parabolically toward the outer periphery and is 1.560 μm at the outermost portion of the outer periphery, remote from the center of the substrate by 25 mm, as shown in FIG. 1(a). Further, the number of elements for each oscillation wavelength, collected in 1 nm unit of the width of 17 nm (0.017 μm) covering the oscillation wavelength range from 1.543 μm to 1.560 μm was 855 constantly as shown in FIG. 1(b). Further, since ΔE1 is controlled in the range 0~+10 meV throughout the surface of the substrate, an average value of the laser oscillation threshold current as low as 5.25 mA (standard deviation±0.22 mA) and an average value of the slope efficiency as high as 0.32 W/A (standard deviation±0.015 W/A) were realized with good uniformity.

According to a second embodiment of the present invention, a plurality of DFB lasers having different wavelengths are formed simultaneously by controlling the width of the selective growing mask opening. As shown in FIG. 9, gratings 100 each 100 μm wide were formed on a 2-inch (100) n-InP substrate 101 with an interval of 300 μm between adjacent gratings, by using EB exposure and chemical etching. In this case, the pitch of the grating 100 was changed parabolically from 240.4 nm in the center portion of the substrate to 243.3 nm in the outer periphery as shown in FIG. 1(a). Then, a SiO$_2$ film 102 having thickness of 100 nm was deposited thereon by atmospheric pressure thermal CVD. Thereafter, a pair of patterns each Wo wide were formed on each grating 100 in [011] direction with a gap being 16 μm therebetween as a selective growth mask by using photolithography and chemical etching, as shown in FIG. 10. The width Wo of the mask was changed parabolically from 2.3 μm in the center portion of the substrate to 0.8 μm in the outer periphery thereof as shown in FIG. 7. On the thus patterned substrate, an InGaAsP strain MQW structure was selectively grown by low pressure MOVPE at growing temperature of 625° C. and growing pressure of 100 hPa, as shown by a cross sectional structure in FIG. 11(a), In detail, the layer structure includes an n-InGaAsP (band gap wavelength (λg)=1.13 μm, 70 nm thick), an n-InP spacer layer (40 nm thick), an n-InGaAsP (λg=1.20 μm, 60 nm thick), a multiple quantum well structure formed by repeating formation of a 0.7% compressive strain InGaAsP well (8 nm thick) and an InGaAsP (λg=1.20 μm, 10 nm thick) barrier 8 times, and a p-InP layer (100 nm thick). According to measurements of the photo luminescence wavelength distribution in the surface of this strain MQW selectively grown layer by means of a microscopic photo luminescence device, the wavelength was 1.548 μm in the center portion of the substrate, was increased parabolically toward the outer periphery thereof and was 1.565 μm at the outermost portion of the outer periphery, remote from the center portion by 25 mm, as shown in FIG. 7. Thereafter, a SiO$_2$ mask 104 was formed on only an upper surface of the strain MQW structure as shown in FIG. 11(b) and current block layers 105, 106 and 107 were selectively grown with using the SiO$_2$ mask 104 as a selective growing mask to bury the MQW structure, as shown in FIG. 11(c). Incidentally, although the p-InP layer 107 is provided in order to prevent a p-n junction from being formed in a re-grown interface, it is not always necessary in the construction of the present invention. Finally, the SiO$_2$ mask 104 was removed and, then, a p-InP clad layer 108 and a p+-InGaAs cap layer 109 were grown as shown in FIG. 11(d). Then, after an electrode forming step, a semiconductor laser was formed as shown in FIG. 11(e). The thus formed elements each 450 μm long is cut out and, after front and rear end faces of the elements were coated with reflection films having reflectivity's of 0.1% and 90%, respectively, characteristics of the element was evaluated.

According to the evaluation, it was found that the DFB laser oscillation wavelength in the center portion of the substrate is 1.543 μm, is increased parabolically toward the outer periphery and is 1.560 μm at the outermost portion of the outer periphery, remote from the center of the substrate by 25 nm, as shown in FIG. 1(a). Further, the number of elements for each oscillation wavelength, collected in 1 nm unit of the width of 17 nm (0.017 μm) covering the oscillation wavelength range from 1.543 μm to 1.560 μm was 855 constantly as shown in FIG. 1(b). Further, since ΔE1 is controlled in the range 0~+10 meV throughout the surface of the substrate, an average value of the laser oscillation threshold current as low as 5.25 mA (standard deviation±1.15 mA) and an average value of the slope efficiency as high as 0.31 W/A (standard deviation±0.025 W/A) were realized with good uniformity. Variations of the threshold current and the efficiency in the second embodiment are large to some extent compared with the first embodiment. This is because the width of the active layer is changed within the substrate surface.

According to a third embodiment of the present invention, a plurality of DFB lasers having different wavelengths are formed simultaneously by controlling temperature in the surface of the substrate. As shown in FIG. 9, gratings 100 each 10 μm wide were formed on a 2-inch (100) n-InP substrate 101 with an interval of 300 μm between adjacent gratings, by using EB exposure and chemical etching. In this case, the pitch of the gratings 100 was changed parabolically from 243.3 nm in the center portion of the substrate to 240.4 nm in the outer periphery as shown in FIG. 1(a). Then, a $SiO_2$ film 102 having thickness of 100 nm was deposited thereon by atmospheric pressure thermal CVD. Thereafter, a pair of patterns each 16 μm wide were formed on each grating 100 in [011] direction with a gap being 1.5 μm therebetween as a selective growth mask by using photolithography and chemical etching, as shown in FIG. 10. On the thus patterned substrate, an InGaAsP strain MQW structure having a cross section shown in FIG. 11(a) was selectively grown by low pressure MOVPE at growing temperature Tg and growing pressure of 100 hPa. The growing temperature Tg was set such that it is changed from 621° C. at the center portion of the substrate toward 628° C. at the outer periphery thereof as shown in FIG. 8. The strain MQW layer structure includes an n-InGaAsP (band gap wavelength (λg)=1.13 μm, 70 nm thick), an n-InP spacer layer (40 nm thick), an n-InGaAsP (λg=1.20 μm, 60 nm thick), a multiple quantum well structure formed by repeating formation of a 0.7% compressive strain InGaAsP well (8 nm thick) and an InGaAsP (λg=1.20 μm, 10 nm thick) barrier 8 (eight) times, and a p-InP layer (100 nm thick).

According to measurements of the photo-luminescence wavelength distribution in the surface of this strain MQW selectively grown layer by means of a microscopic photo-luminescence device, it was confirmed that the wavelength is 1.565 μm in the center portion of the substrate, is reduced parabolically toward the outer periphery thereof and is 1.548 μm at the outermost portion of the outer periphery, remote from the center portion by 25 mm, as shown in FIG. 8.

Thereafter, a $SiO_2$ mask 104 was formed on only an upper surface of the strain MQW structure as shown in FIG. 11(b) and current block layers 105, 106 and 107 were selectively grown with using the $SiO_2$ mask 104 as a selective growing mask to bury the MQW structure, as shown in FIG. 11(c). Incidentally, although the p-InP layer 107 is provided in order to prevent a p-n junction from being formed in a re-grown interface, it is not always necessary in the construction of the present invention. Finally, the $SiO_2$ mask 104 was removed and, then, a p-InP clad layer 108 and a p+-InGaAs cap layer 109 were grown as shown in FIG. 11(d). Then, after an electrode forming step, a semiconductor laser was formed as shown in FIG. 11(e). The element thus formed and 450 μm long is cut out and, after front and rear end faces were coated with reflection films having reflectivity's of 0.1% and 90%, respectively, characteristics of the elements were evaluated.

According to the evaluation, it was found that the DFB laser oscillation wavelength in the center portion of the substrate is 1.560 μm, is reduced parabolically toward the outer peripheral and is 1.543 μm at the outermost portion of the outer periphery, remote from the center of the substrate by 25 mm. Further, the number of elements for each oscillation wavelength, collected in 1 nm unit of the width of 17 nm (0.017 μm) covering the oscillation wavelength range from 1.543 μm to 1.560 μm was 855 constantly as shown in FIG. 1(b). Further, since ΔE1 is controlled in the range 0~+10 meV throughout the surface of the substrate, an average value of the laser oscillation threshold current as low as 5.11 mA (standard deviation±0.75 mA) and an average value of the slope efficiency as high as 0.33 W/A (standard deviation±0.008 W/A) were realized with good uniformity.

Figure 12:
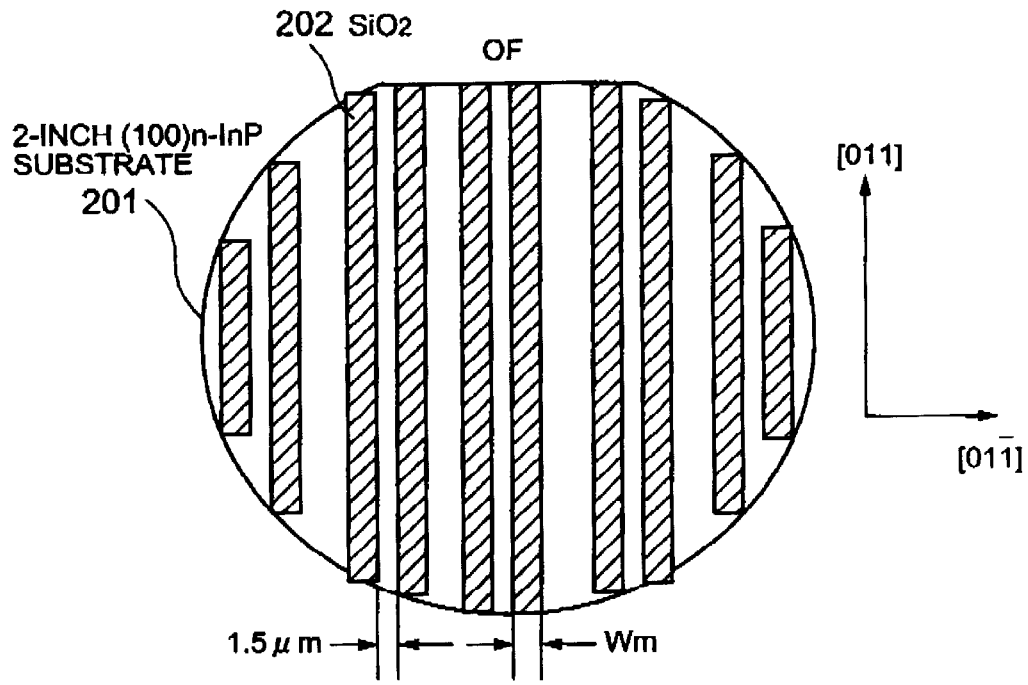
FIG. 12 shows a mask pattern illustrating another embodiment of the present invention.

As a fourth embodiment of the present invention, the present invention is applied to a fabrication of a plurality of EA modulators having different wavelengths. As shown in FIG. 12, paired $SiO_2$ patterns 202 each Wm wide with a mask opening width being 1.5 μm were formed on a 2-inch (100) n-InP substrate 101 in [011] direction. The mask width Wm was changed parabolically from 6 μm in the center portion of the substrate to 8.5 μm in the outer periphery thereof as shown in FIG. 5(b). On the thus patterned substrate, an InGaAsP strain MQW structure having a cross section shown in FIG. 13(a) was selectively grown by low pressure MOVPE at growing temperature 625° C. and growing pressure of 100 hPa. The MQW structure includes an n-InGaAsP (band gap wavelength (λg)=1.20 μm, 60 nm thick), a multiple quantum well structure formed by repeating formation of a 0.5% compressive strain InGaAsP well (6 nm thick) and an InGaAsP (λg=1.20 μm, 7 nm thick) barrier 8 (eight) times, and a p-InP layer (100 nm thick).

According to measurements of the photo-luminescence wavelength distribution in the surface of this strain MQW selectively grown layer by means of a microscopic photo-luminescence device, the wavelength was 1.478 μm in the center portion of the substrate, was increased parabolically toward the outer periphery thereof and was 1.495 μm at the outermost portion of the outer periphery, remote from the center portion by 25 mm, as shown in FIG. 5(b). Thereafter, a portion of the $SiO_2$ mask 202 is removed and then a p-InP clad layer 204 and a p-InGaAs cap layer 205 were grown as shown in FIG. 13(b). Then, after an electrode forming step, semiconductor EA modulators were formed as shown in FIG. 13(c). The thus formed elements each 300 μm long were cut out and front and rear end faces were coated with non-reflection films having reflectivity not more than 0.1%. An evaluation of characteristics of elements thus formed was then performed.

According to the evaluation performed by injecting DFB laser lights having discrete energies separated by 35 meV from each other to the EA modulators having different absorption layer band gaps, it was confirmed that an average insertion loss of 500 elements randomly picked up from the whole substrate as low as 2.15 dB (standard deviation±0.15 dB), an average light extinction ratio when a reverse bias voltage 2V is applied as high as 23.5 dB (standard deviation±1.12 dB) are achieved with good uniformity.

Figure 2A:
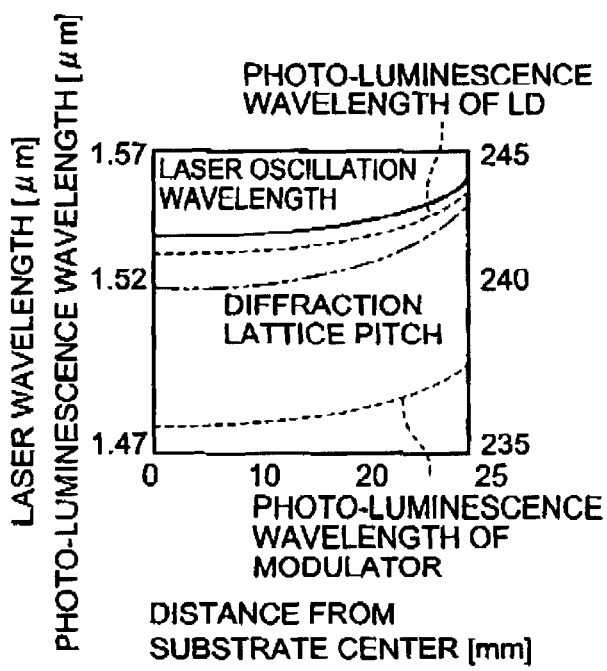
FIGS. 2(a) and 2(b) show characteristics curves illustrating the principle of the present invention.
Figure 14:
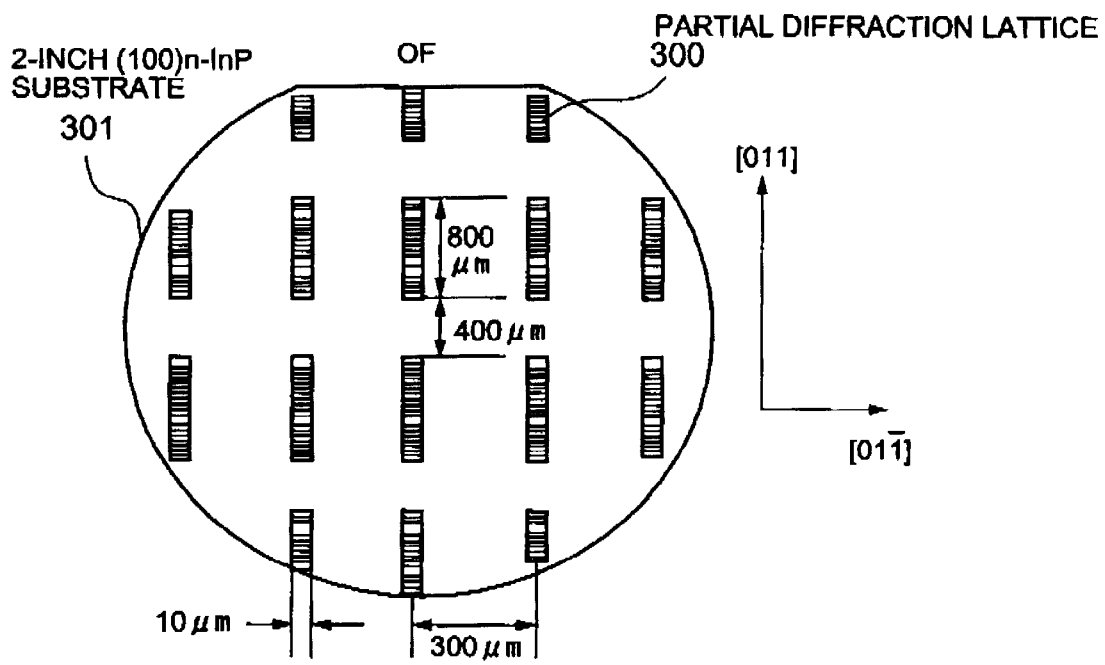
FIG. 14 shows a circular semiconductor substrate formed with discrete partial gratings, illustrating another embodiment of the present invention.
Figure 15:
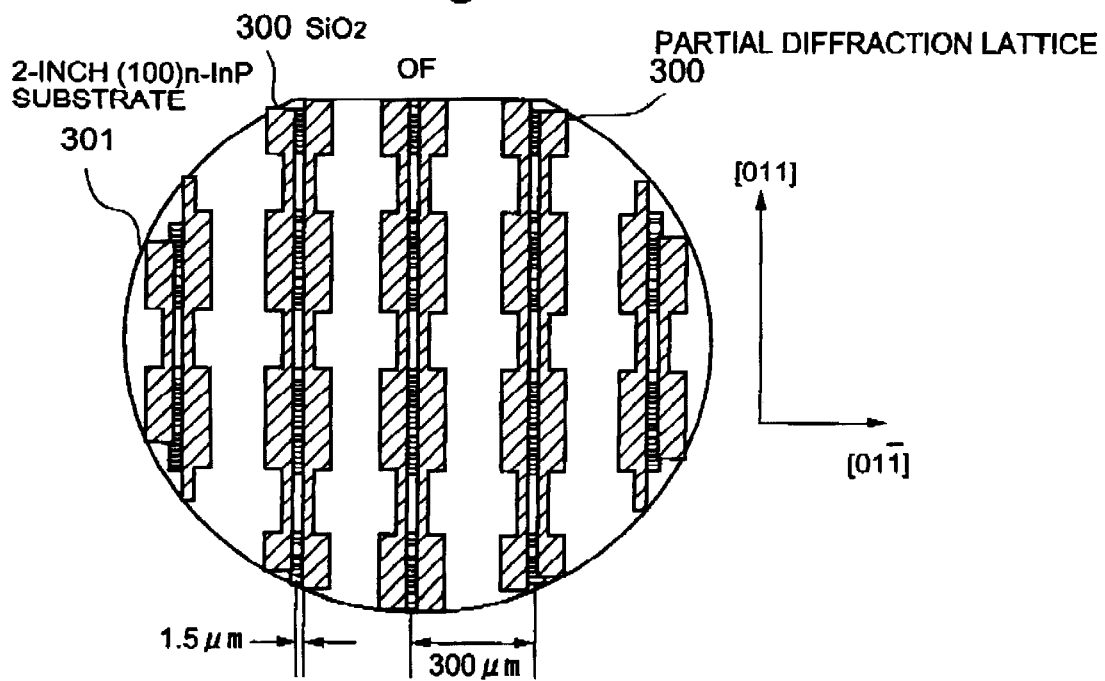
FIG. 15 shows a mask pattern formed on the circular semiconductor substrate shown in FIG. 14.
Figure 16:
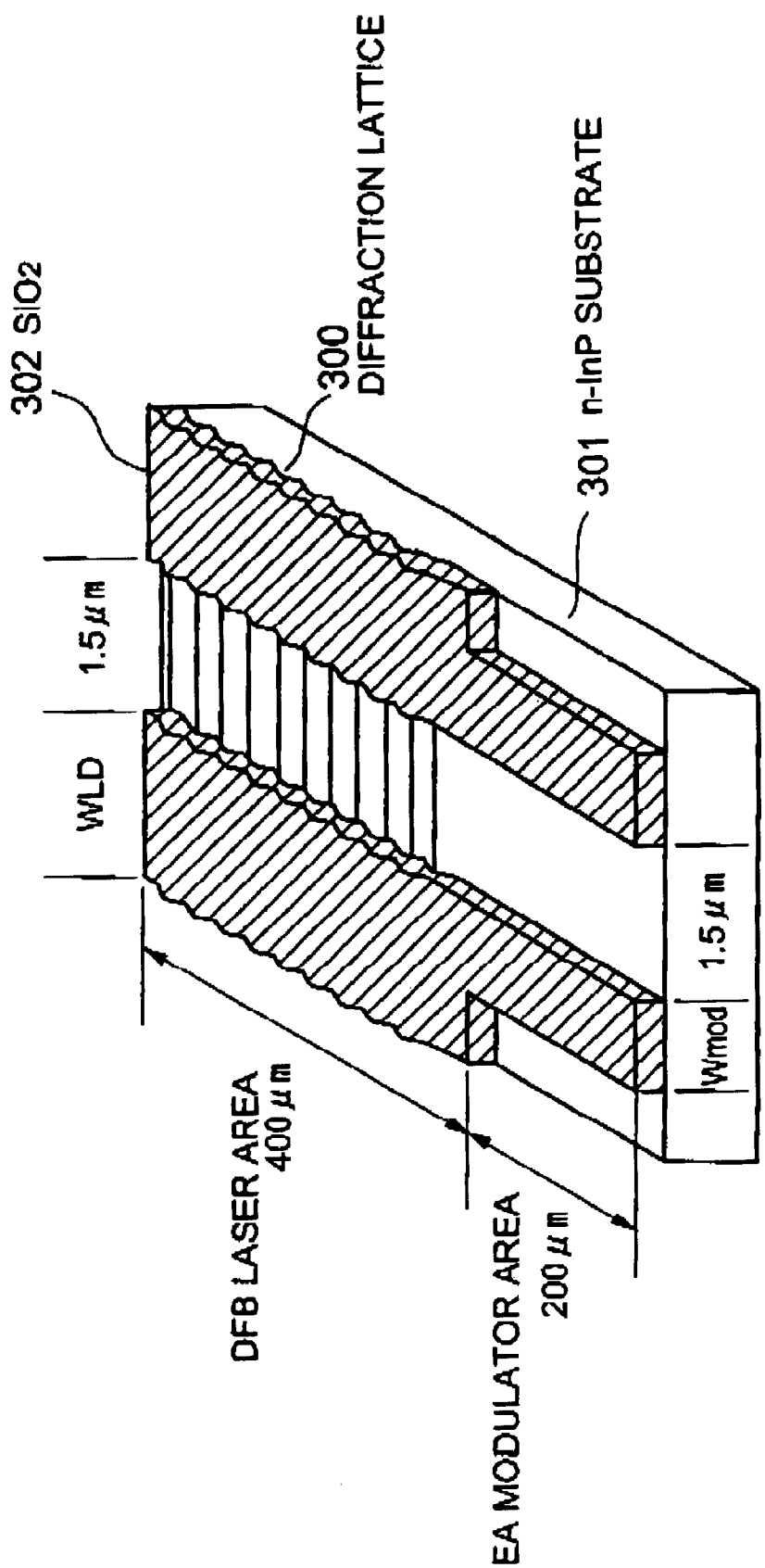
FIG. 16 shows a portion of the mask pattern shown in FIG. 15.

According to a fifth embodiment, the present invention is applied to an EA modulator integrated DFB laser. As shown in FIG. 14, partial gratings 300 each 10 μm wide and 800 μm long were formed on a 2-inch (100) n-InP substrate 301 with an interval of 300 μm and a gap of 400 m between adjacent lattices in [011] direction, by using EB exposure and chemical etching. In this case, the pitch of the grating 300 was changed parabolically from 240.4 nm in the center portion of the substrate to 243.3 nm in the outer periphery thereof, as shown in FIG. 2(a). Then, a SiO$_2$ film 302 was deposited to a thickness of 100 nm by atmospheric pressure thermal CVD. Thereafter, as shown in FIG. 15, a pair of patterns each having masks each WLD wide in the grating forming area and masks each Wmod wide in the area in which the grating is not formed were formed in [011] direction with a gap, namely, an opening width, being 1.5 μm, by using photolithography and chemical etching. The width WLD was changed parabolically from 16 μm in the center portion of the substrate to 18.5 μm in the outer periphery thereof as shown in FIG. 5(a) and the width Wmod was changed parabolically from 6 μm in the center portion of the substrate to 8.5 μm in the outer periphery thereof as shown in FIG. 5(a). FIG. 16 is a perspective view of the patterning of a unit EA modulator integrated DFB laser element. The area in which the grating is formed corresponds to the DFB laser and the area in which grating is not formed corresponds to an area which becomes the EA modulator. There is one grating forming area 400 μm long in the unit element. However, the area having mask width WLD, which becomes the DFB laser area, is patterned to provide a length of 425 μm. This is because crystal composition is changed by the gas phase diffusion effect of the selective growth in a transition area in which the mask width is changed from WLD to Wmod and the equivalent refraction index of the waveguide is changed, so that an adverse effect on the DFB oscillation spectrum characteristics is restricted.

Figure 13A:
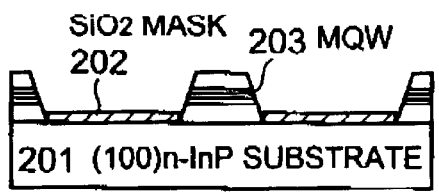
FIGS. 13(a) to 13(c) show cross sections of a wafer illustrating manufacturing steps according to the embodiment shown in FIG. 12.
Figure 13B:
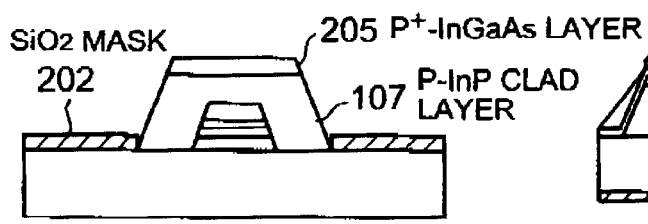
Figure 13C:
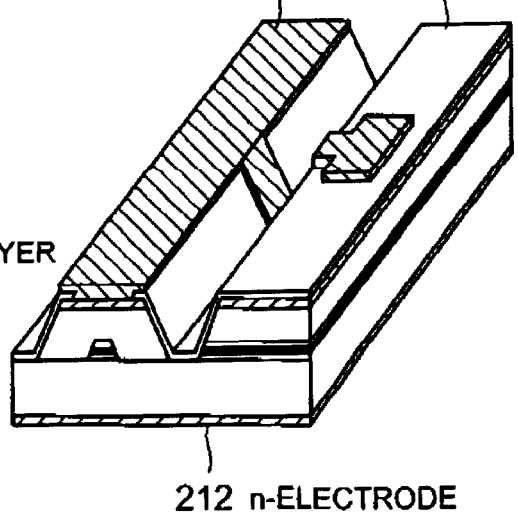

On the thus patterned substrate, an InGaAsP strain MQW structure similar to that shown in FIG. 13(a) was selectively grown by low pressure MOVPE at growing temperature of 625° C. and growing pressure of 100 hPa. In detail, the layer structure includes an n-InGaAsP (band gap wavelength (λg)=1.13 μm, 50 nm thick), an n-InP spacer layer (30 nm thick), an n-InGaAsP (λg=1.20 μm, 40 nm thick), a multiple quantum well structure formed by repeating formation of a 0.7% compressive strain InGaAsP well (6 nm thick) and an InGaAsP (λg=1.20 μm, 6 nm thick) barrier 8 (eight) times, and a p-InP layer (100 nm thick). It should be noted that the above mentioned film thickness values are in the modulator area having width Wmod and these values become about 1.4 times, respectively, in the DFB laser area having width WLD.

Figure 17:
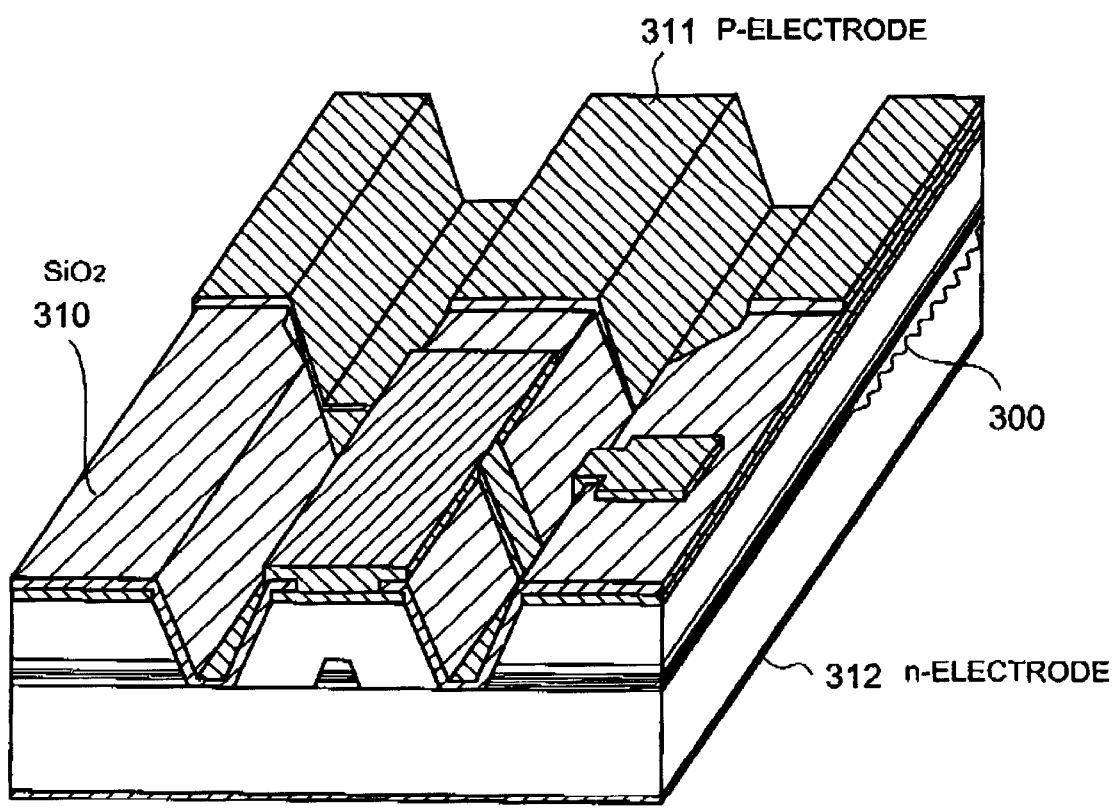
FIG. 17 shows a structure of an element illustrating another embodiment of the present invention.
Figure 18:
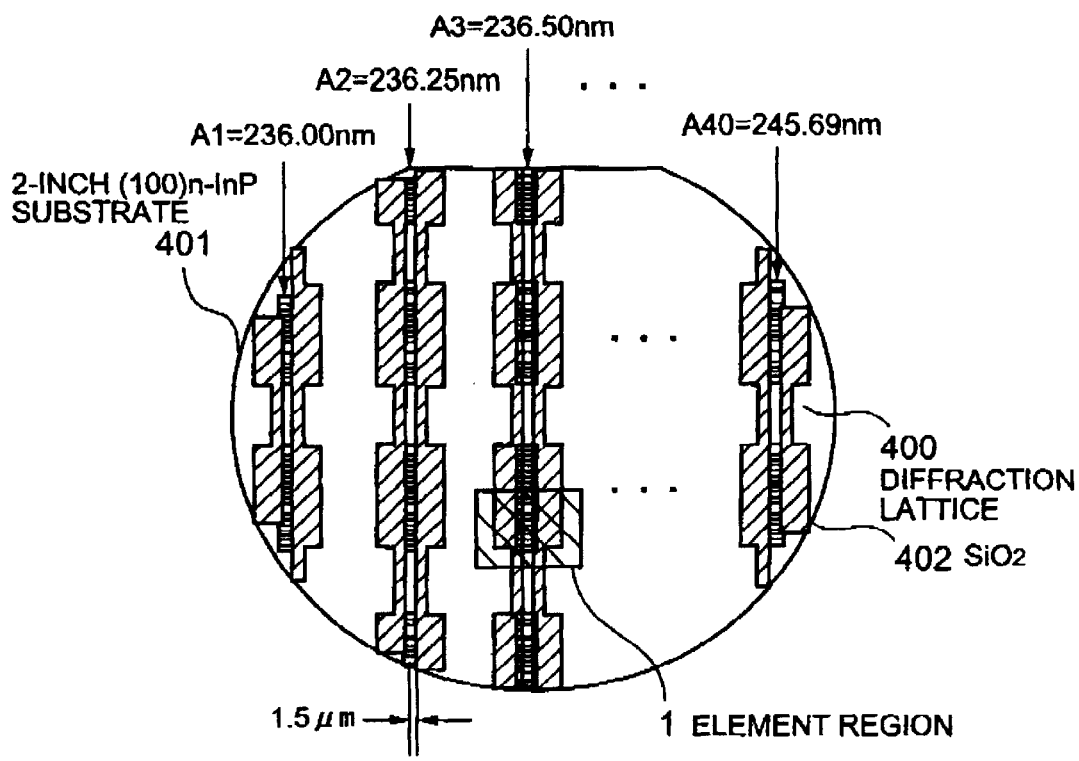
FIG. 18 shows a mask pattern used in a conventional fabrication method.
Figure 19A:
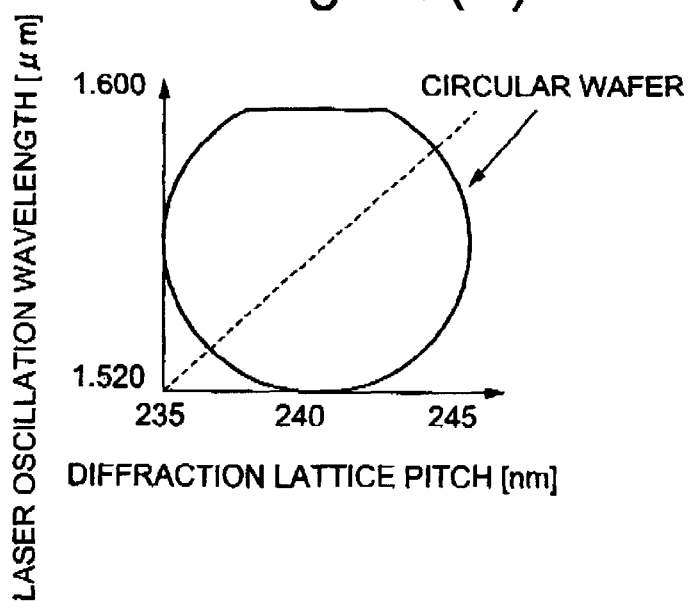
FIGS. 19(a) and 19(b) show characteristics curves of a conventional element.
Figure 19B:
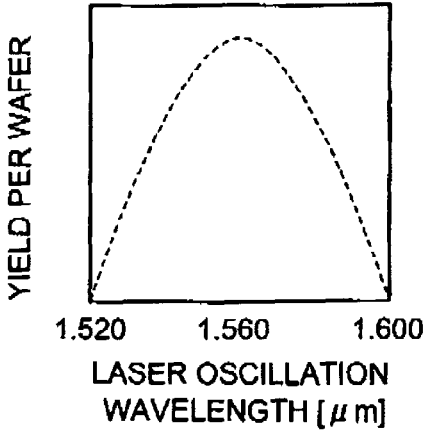

According to measurements of the photo-luminescence wavelength distribution in the surface of this strain MQW selectively grown layer by means of a microscopic photo-luminescence device, the wavelength was 1.480 μm in the center portion of the substrate, was increased parabolically toward the outer periphery thereof and was 1.497 μm at the outermost portion of the outer periphery, remote from the center portion by 25 mm, in the modulator area having mask width Wmod, as shown in FIG. 2(a). On the other hand, the wavelength was 1.548 μm in the center portion of the substrate, was increased parabolically toward the outer periphery thereof and was 1.565 μm at the outermost portion of the outer periphery, remote from the center portion by 25 mm, in the DFB laser area having mask width WLD. Thereafter, a portion of the SiO$_2$ mask 202 was removed as shown in FIG. 13(b) and a p-InP clad layer 204 and a p-InGaAs cap layer 205 were formed in the mask opening portion After the DFB laser area and the EA modulator area were electrically isolated from each other and the electrodes were formed, semiconductor EA modulators were formed as shown in FIG. 17. The thus formed elements each 600 μm long (DFB laser area 425 μm+EA modulator area 175 μm) were cut out and, after DFB laser side end faces and EA modulator side end faces thereof were coated with a high reflection film having reflectivity of 95% and a non-reflection film having reflectivity not higher than 0.1%, respectively, characteristics of the element was evaluated.

Figure 2B:
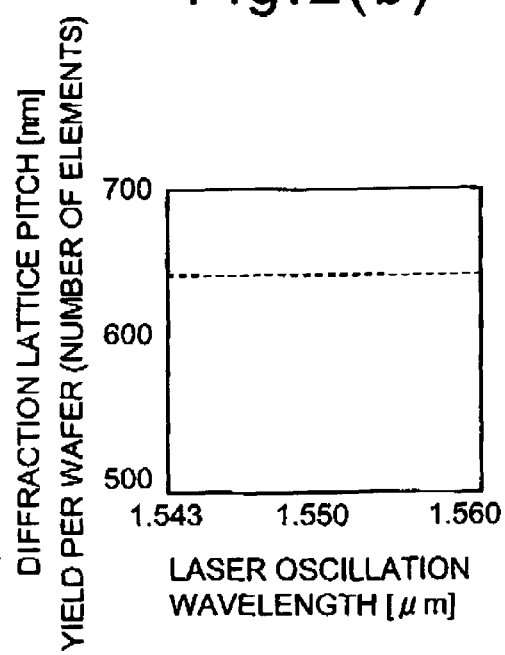

According to the evaluation, it was found that, the DFB laser oscillation wavelength is increased parabolically from 1.543 μm in the center portion of the substrate to 1.560 μm in the outermost portion of the outer periphery, remote from the center of the substrate by 25 mm, as shown in FIG. 2(a). Therefore, the detuning energy (1): ΔE1=E(DFB)−E(gain peak) is controlled between 0~+10 meV throughout the surface of the substrate and the detuning energy (2): ΔE2= E(mod)−E(DFB), which represents the relation between the band gap energy E(mod) of the absorption layer of the EA modulator and the E(DFB) is controlled within a range 25~35 meV throughout the surface of the substrate. Further, it was confirmed that the number of elements for each oscillation wavelength, collected in 1 nm unit of the width of 17 nm (0.017 μm) covering the oscillation wavelength range from 1.543 μm to 1.560 μm was 641 constantly as shown in FIG. 2(b). Further, an average value of the laser oscillation threshold current of the DFB laser as low as 5.35 mA (standard deviation±0.22 mA), an average value of the slope efficiency as high as 0.28 W/A (standard deviation±0.015 W/A) and an average light extinction ratio when a reverse bias voltage of 2V is applied to the EA modulator as high as 23.5 dB (standard deviation±1.12 dB) were realized with good uniformity. 102 elements randomly extracted from the wafer substrate surface were evaluated on a normal fiber transmission with 2.5 Gb/s modulation through 1000 km and it was confirmed that a highly uniform transmission characteristics was realized with an average value of power penalty being 0.35 dB (standard deviation±0.03 dB).

It should be noted that, although the embodiments of the present invention have been described with respect to the 2-inch InP substrate as the circular semiconductor substrate, the present invention can be applied to other general circular semiconductor substrate having diameter of 3 inches or 4 inches, etc. Further, although the fabrication method of an optical semiconductor device having different wavelength in the range of 17 nm has been described, the wavelength is not limited to this range and it can be expanded so long as crystal quality allows. The elements constituting the optical semiconductor device are not limited to InGaAsP system. The present invention can be applied to a III–V group compound semiconductor containing at least one of In, Ga and Al of the III group and at least one of As, P, Sb and N of the V group, or a II–VI group compound semiconductor belonging to ZnMgBeSSc system.

It is apparent that the present invention is not limited to the above embodiments, but may be modified and changed without departing from the scope and spirit of the invention.

What is claimed is:

1. A method of fabricating a plurality of optical devices having differing operational characteristics on a common semiconductor substrate, comprising the step of forming said optical devices of said common semiconductor substrate such that said optical devices that are formed centrally of said semiconductor substrate have operational band gap energies that vary according to a substantially parabolic profile, relative to said optical devices that are formed peripherally of said common semiconductor substrate.

2. The method of fabricating a plurality of optical devices as claimed in claim 1, wherein representing the distance from the center of said semiconductor substrate by R, an operational band gap energy of said first one of the optical devices by E(0), and an operational band gap energy or said second one of the optical devices at a position which is distance R from the center of said semiconductor substrate by E(R), $$E(R)=k \cdot R^2 + E(0) \; [eV]$$

where k is proportional coefficient.

3. The method of fabricating a plurality of optical devices as claimed in claim 1, wherein said optical devices are semiconductor lasers.

4. The method of fabricating a plurality of optical devices as claimed in claim 3, wherein said semiconductor lasers are distributed feedback laser diodes or distributed Bragg reflector laser diodes.

5. The method of fabricating a plurality of optical devices as claimed in claim 4, wherein a pitch of diffraction lattices formed on a waveguide or in the vicinity of the waveguide of said first one of the optical devices has a substantially parabolic difference from a pitch of diffraction lattices formed in a waveguide or in the vicinity of the waveguide of said second one of the optical devices.

6. The method of fabricating a plurality of optical devices as claimed in claim 5, wherein E(DFB)–E(gain peak) is constant in a range from –5 meV to +15 meV where E(DFB) is energy or Bragg wavelength (laser oscillation wavelength) determined by the diffraction lattice pitch and E(gain peak) is energy of a gain peak wavelength of an active layer of said semiconductor laser.

7. The method of fabricating a plurality of optical devices as claimed in claim 1, wherein said optical devices are semiconductor optical modulators of an electro-absorption type.

8. The method of fabricating a plurality of optical devices as claimed in claim 1, wherein said optical devices are semiconductor optical integrated devices having a distributed feedback laser diode monolithically integrated with a semiconductor optical modulator of an electro-absorption type or a distributed Bragg reflector laser diode monolithically integrated with a semiconductor optical modulator of an electro-absorption type.

9. The method of fabricating a plurality of optical devices as claimed in claim 8, wherein E(mod)–E(DFB) is constant in a range from 20 meV to 40 meV where E(mod) is band gap energy of the optical absorption layer of said EA modulator and E(DFB) is energy of said distributed feedback laser diode or said distributed Bragg reflector laser diode.

10. The method of fabricating a plurality of optical devices as claimed in claim 1, further comprising the step of growing a semiconductor layer constituting said optical devices by metal-organic vapor phase epitaxy; while parabolically changing a temperature distribution of said semiconductor substrate from a center portion of said semiconductor substrate toward an outer periphery of said semiconductor substrate.

11. The method of fabricating a plurality of optical devices as claimed in claim 1, further comprising:
forming dielectric films on said semiconductor substrate such that a width of an opening portion of a first one of the dielectric films, that is formed at a center portion of said semiconductor substrate, has a substantially parabolic difference from a width of an opening portion of a second one of the dielectric films, that is formed apart from said first one of the dielectric films, and growing a semiconductor layer constituting said optical devices by selective metal-organic vapor phase epitaxy using said dielectric films as growth blocking masks.

12. The method of fabricating a plurality of optical devices as claimed in claim 1, further comprising the step of cutting said semiconductor substrate such that said plurality of optical devices are in pieces.

13. A method of fabricating a plurality of optical devices having differing operational characteristics on a common semiconductor substrate, comprising:
defining a plurality of areas on said common semiconductor substrate such that changes in operational band gap energy among said areas satisfies a substantially parabolic relationship, and
forming at least one of said optical devices in each of said areas.

14. The method as claimed in claim 13, wherein said areas are defined so that an inner one of said areas is surrounded by outer ones of said areas.

15. The method of fabricating a plurality of optical devices as claimed in claim 15, wherein said optical devices are semiconductor lasers.

16. The method of fabricating a plurality of optical devices as claimed in claim 15, wherein said semiconductor lasers are distributed feedback laser diodes or distributed Braag reflector laser diodes.

17. The method of fabricating a plurality of optical devices as claimed in claim 16, wherein a change in a pitch of diffraction lattices among said areas satisfies a parabolic relationship.

18. The method of fabricating a plurality of optical devices as claimed in claim 17, wherein E(DFB)–E(gain peak) is constant in a range from –5 meV to +15 meV where E(DFB) is energy of Bragg wavelength (laser oscillation wavelength) determined by the diffraction lattice pitch and E(gain peak) is energy of a gain peak wavelength of an active layer of said semiconductor laser.

19. The method of fabricating a plurality of optical devices as claimed in claim 13, wherein said optical devices are semiconductor optical modulators of an electro-absorption type.

20. The method of fabricating a plurality of optical devices as claimed in claim 13, wherein said optical devices are semiconductor optical integrated devices having a distributed feedback laser diode monolithically integrated with a semiconductor optical modulator of an electro-absorption type or a distributed Bragg reflector laser diode monolithically integrated with a semiconductor optical modulator of an electro-absorption type.

21. The method of fabricating a plurality of optical devices as claimed in claim 20, wherein E(mod)–E(DFB) is constant in a range from 20 meV to 40 meV where E(mod) is band gap energy of the optical absorption layer of said EA modulator and E(DFB) is energy of said distributed feedback laser diode or said distributed Bragg reflector laser diode.

22. The method of fabricating a plurality of optical devices as claimed in claim 13, further comprising the step of growing a semiconductor layer constituting said optical devices by metal-organic vapor phase epitaxy; while parabolically changing a temperature distribution of said semiconductor substrate from a center portion of said semiconductor substrate toward an outer periphery of said semiconductor substrate.

23. The method of fabricating a plurality of optical devices as claimed in claim 13, further comprising:
forming dielectric films on said semiconductor substrate such that change in a width of an opening portion of the dielectric films among said areas satisfies a parabolic relationship, and growing a semiconductor layer constituting said optical devices by selective metal-organic vapor phase epitaxy using said dielectric films as growth blocking masks.

24. The method of fabricating a plurality of optical devices as claimed in claim 13, further comprising the step of cutting said semiconductor substrate such that said plurality of optical devices are in pieces.

25. A method of fabricating a plurality of optical devices having differing operational characteristics on a common semiconductor substrate, comprising:

forming dielectric films on said semiconductor substrate such that dielectric films formed centrally of said semiconductor substrate have widths that vary according to a substantially parabolic profile relative to dielectric films formed peripherally of said semiconductor substrate, and growing a semiconductor layer forming a constituent part of said optical devices, by selective metal-organic vapor phase epitaxy using said dielectric films as growth blocking masks.

26. The method of fabricating a plurality of optical devices as claimed in claim 25, wherein said optical devices are semiconductor lasers.

27. The method of fabricating a plurality of optical devices as claimed in claim 26, wherein said semiconductor lasers are distributed feedback laser diodes or distributed Bragg reflector laser diodes.

28. The method of fabricating a plurality of optical devices as claimed in claim 27, further comprising the step of forming diffraction lattices on said semiconductor substrate such that a pitch of a first one of the diffraction lattices, that is formed at a center portion of said semiconductor substrate, has a substantially parabolic difference from a pitch of a second one of the diffraction lattices, that is formed apart from said first one of the diffraction lattices.

29. The method of fabricating a plurality of optical devices as claimed in claim 28, wherein E(DFB)–E(gain peak) is constant in a range from –5 meV to +15 meV where E(DFB) is energy of Bragg wavelength (laser oscillation wavelength) determined by the diffraction lattice pitch and E(gain peak) is energy of a gain peak wavelength of an active layer of said semiconductor laser.

30. The method of fabricating a plurality of optical devices as claimed in claim 25, wherein said optical devices are semiconductor optical modulators of an electro-absorption type.

31. The method of fabricating a plurality of optical devices as claimed in claim 25, wherein said optical devices are semiconductor optical integrated devices having a distributed feedback laser diode monolithically integrated with a semiconductor optical modulator of an electro-absorption type or a distributed Bragg reflector laser diode monolithically integrated with a semiconductor optical modulator of an electro-absorption type.

32. The method of fabricating a plurality of optical devices as claimed in claim 21, wherein E(mod)–E(DFB) is constant in a range from 20 meV to 40 meV where E(mod) is band gap energy of the optical absorption layer of said EA modulator and E(DFB) is energy of said distributed feedback laser diode or said distributed Braag reflector laser diode.

33. The method of fabricating a plurality of optical devices as claimed in claim 25, further comprising the step of cutting said semiconductor substrate such that said plurality of optical devices are in pieces.

* * * * *